(12) United States Patent
Narwal

(10) Patent No.: US 8,502,559 B2
(45) Date of Patent: Aug. 6, 2013

(54) LEVEL TRANSLATOR

(75) Inventor: Rajesh Narwal, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/298,389

(22) Filed: Nov. 17, 2011

(65) Prior Publication Data

US 2013/0127514 A1    May 23, 2013

(51) Int. Cl.
*H03L 5/00* (2006.01)
*H03K 19/0175* (2006.01)

(52) U.S. Cl.
USPC ............................................. 326/80; 327/333

(58) Field of Classification Search
USPC .............. 326/80, 81, 63, 68, 82, 83; 327/333, 327/218
See application file for complete search history.

(56) References Cited

U.S. PATENT DOCUMENTS

| | | | |
|---|---|---|---|
| 5,111,066 A * | 5/1992 | Artieri et al. | 327/116 |
| 5,426,384 A * | 6/1995 | May | 327/52 |
| 5,892,385 A * | 4/1999 | Hashiguchi | 327/333 |

* cited by examiner

*Primary Examiner* — Daniel D Chang
(74) *Attorney, Agent, or Firm* — Gardere Wynne Sewell LLP

(57) ABSTRACT

A circuit has an input configured to receive a periodic signal having a first value. First circuitry is provided to generate a pulse when said periodic signal has a rising edge and a pulse when said periodic signal has a falling edge. Second circuitry is configured to receive said pulses and responsive thereto to provide an output signal, said output signal having a same duty cycle as said input signal and having a second value.

32 Claims, 2 Drawing Sheets

FIGURE 1
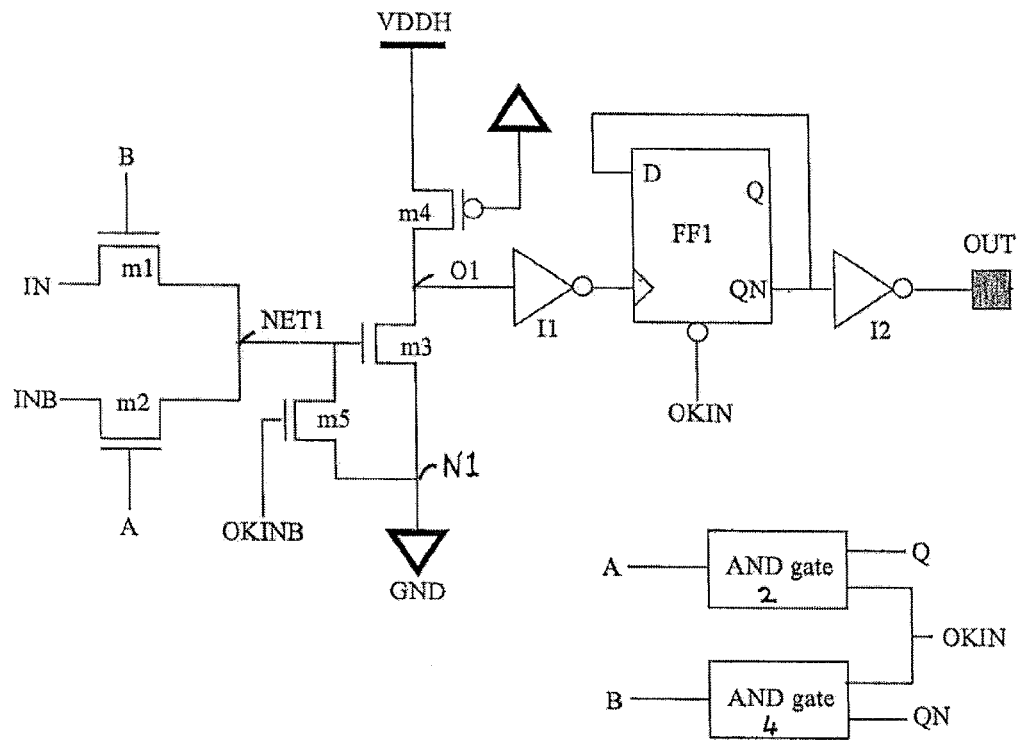
FIGURE 2
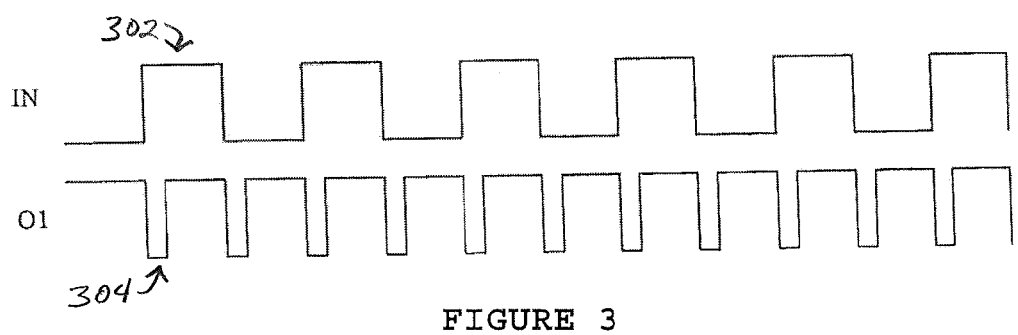
FIGURE 3

LEVEL TRANSLATOR

FIELD OF THE INVENTION

The present invention relates to a level translator and, more particularly, to a circuit for translating a low voltage to a high voltage level.

BACKGROUND OF THE INVENTION

Advances in semiconductor fabrication and manufacturing techniques have led to reduction in operating voltage levels. One reason for using lower operating voltage levels is to reduce the power consumption in semiconductor chips. In some cases where a chip is interfaced with a bus operator according to a standard based on higher voltage levels, typically only the main bulk (core) of the chip is operated at a lower voltage level and its I/O interface is operated at higher voltage levels. In order to implement such a scheme, the chip translates high-voltage I/O signals to low-voltage core signals and low-voltage core signals to high-voltage I/O signals.

SUMMARY

In one embodiment of the present disclosure, there is provided a circuit comprising: an input operable to receive a periodic signal having a first value; first circuitry operable to generate a pulse when said periodic signal has a rising edge and when said periodic signal has a falling edge; and second circuitry operable to receive said pulses and responsive thereto to provide an output signal, said output signal having a same duty cycle as said periodic signal and having a second value different from said first value.

In another embodiment of the present disclosure, there is provided a circuit comprising: a first part operable to receive a periodic voltage signal having a first level and a first control signal; a second part operable to receive an inverse of said periodic voltage signal and a second control signal, said second part comprising circuitry similar to said first part; a transistor operable to be controlled by said first and second parts; a node, a voltage of which operable to be controlled by said transistor to provide a pulse when said periodic voltage signal has a rising edge and when said periodic voltage signal has a falling edge; and a flip flop operable to receive said pulses and responsive thereto to provide an output voltage signal, said output voltage signal having a same duty cycle as said periodic voltage signal and having a second level greater than said first level.

In yet another embodiment of the present disclosure, there is provided a circuit comprising: input circuitry operable to receive a periodic signal having a first value; first circuitry operable to generate a pulse when said periodic signal has a rising edge and when said periodic signal has a falling edge; and second circuitry operable to receive said pulses and responsive thereto to provide an output signal, said output signal having a same duty cycle as said periodic signal and having a second value.

BRIEF DESCRIPTION OF THE DRAWINGS

Embodiments are illustrated by way of example in the accompanying Figures in which like reference numbers indicate similar parts, and in which:

FIG. 1 illustrates a first circuit;

FIG. 2 illustrates a second circuit for use in conjunction with the circuit illustrated in FIG. 1;

FIG. 3 illustrates a timing diagram of an input voltage and the signal at a node of the circuit illustrated in FIG. 1.

DETAILED DESCRIPTION OF THE DRAWINGS

Figure 4:
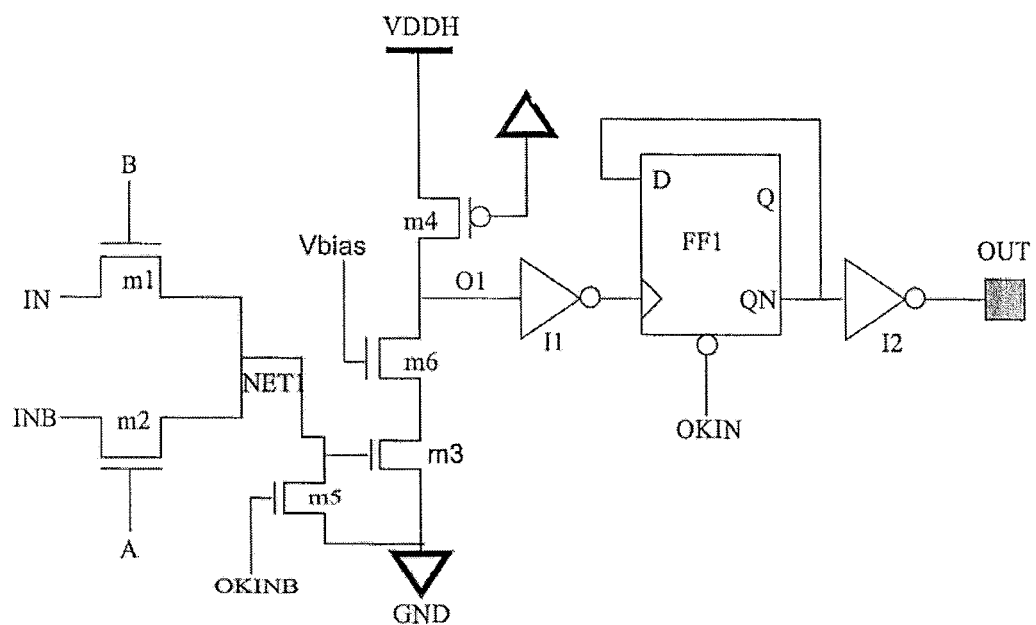
FIG. 4 illustrates a modification to the circuit illustrated in FIG. 1.

Reference is made to the circuit of FIG. 1. A first NMOS (negative metal oxide semiconductor) transistor m1 has its gate connected or coupled to node B. The source of the first transistor m1 is connected or coupled to a low voltage input signal IN and the drain is connected or coupled to a node referenced NET1.

A second NMOS transistor m2 is provided. The drain of the second NMOS transistor m2 is connected or coupled to the node NET1. The gate of the second NMOS transistor m2 is connected or coupled to node A. The source of the second NMOS transistor m2 is connected or coupled to a second low voltage input signal INB, wherein INB is an inverted signal of IN.

The node NET1 is connected or coupled to the gate of a third NMOS transistor m3. The source of the third NMOS transistor m3 is connected or coupled to ground via a node referenced N1. The drain of the third NMOS transistor m3 is connected or coupled to a node referenced O1. The node O1 is connected or coupled to the drain of a fourth PMOS (positive metal oxide semiconductor) transistor m4. The source of the fourth PMOS transistor m4 is connected or coupled to a voltage supply VDDH, wherein VDDH is a high voltage supply. The gate of the fourth PMOS transistor m4 is tied to ground.

In some embodiments, the fourth transistor can be replaced by a constant current source. In other embodiments, the gate of the fourth transistor may be controlled by a constant bias circuit.

A fifth NMOS transistor m5 is provided. The drain of the fifth NMOS transistor m5 is connected or coupled to the node NET1. The source of the fifth NMOS transistor m5 is connected or coupled to the node N1, which is connected or coupled to ground. The gate of the fifth NMOS transistor M5 receives a signal OKINB. Signal OKINB is the inverse of signal OKIN. Signal OKIN is a signal which remains at logic 0 until the high voltage and low voltage supplies are not available in their respective ranges.

The node O1 provides an input to an inverter I1. The output of the inverter I1 is input to the clock input of a first flip-flop FF1. In some embodiments, the first flip-flop FF1 may be a toggle flip-flop. The QN output (the inverse of the Q output) is connected or coupled to the D input of the flip-flop FF1. The reset signal for the flip-flop FF1 is provided by the signal OKIN. The QN output of the first flip-flop FF1 is input to a second inverter I2, the output of which provides the output of the circuit. This is the high voltage output.

Reference is made to FIG. 2 which shows a first AND gate 2 and a second AND gate 4. The first AND gate 2 has an output connected or coupled to node A and the second AND gate 4 has an output connected or coupled to node B.

The first AND gate 2 receives an input from the Q output of the first flip-flop FF1 and an input from the signal OKIN. The second AND gate 4 receives the QN output of the first flip-flop FF1 and the signal OKIN.

The operation of the circuitry of FIGS. 1 and 2 will now be described in greater detail. The circuitry is configured to convert a low voltage input signal, that is signal IN to a high voltage output signal OUT.

By way of example, the low voltage may be of the order of 1V to 1.5V. For example, in one embodiment, the low voltage may be around 1.2V. The high voltage may be between 3.3V to 5.0V. It should be noted that these values are by way of example only and other voltages may be used for the low and/or high voltages.

Initially, OKIN is at state logic 0. If OKIN is at logic state 0, the output of the first and second AND gates 2 and 4 will also be 0. This means that nodes A and B will be 0. Since nodes A and B are connected or coupled to the gates of the first and second NMOS transistors m1 and m2, respectively, both of these transistors will be off. The fifth transistor m5 receives the inverse of the signal OKIN and, accordingly, that signal is high. This causes node NET1 to be pulled down to ground by the fifth NMOS transistor m5.

As node NET1 is at ground, the third NMOS transistor m3 will be off.

The fourth transistor m4 will be on and, accordingly, node O1 will be at VDDH. This means that the output of the first inverter I1 is low. In practice, this means that the clock to the first flip-flop FF1 is 0. Furthermore, OKIN will act as a reset to the first flip-flop FF1. As OKIN is at 0, this will force the Q output of the first flip-flop FF1 to 0. This means that the QN output of the first flip-flop FF1 will be 1. This is input to the second inverter I2 which will provide a low output voltage OUT. The output voltage OUT in the reset condition will remain 0.

When OKIN is equal to 1, this will cause the output of the second AND gate 4 to be high. At this point QN is high. As Q itself is still low, the output of the AND gate 2 will be low.

As node B is high, i.e. at VDDH, this will pass the low voltage input signal at the source of the first NMOS transistor m1 through the transistor. This means that the voltage at node NET1 will be the low voltage input signal IN. If IN is 0, node NET1 is at 0 and the scenario previously described applies. This means that the output node out will stay at 0.

If, however, the low voltage input signal is at "1", that is the low voltage value, the third NMOS transistor m3 will be switched on and this will pull the node O1 down. It should be noted that transistor m3 is typically stronger than the fourth PMOS transistor m4. The fifth transistor m5 will be switched off as OKINB (the inverse of OKIN) will be equal to 0.

Pulling node O1 down means that the input to the first inverter I1 is low. This means that the output of the first inverter will be high. This will cause a positive edge to be provided at the clock input of the first flip-flop FF1. It should be appreciated that, in this embodiment, the first flip-flop FF1 is positive edge triggered. This positive edge will toggle the output and cause Q to be equal to 1. QN will then be equal to 0. This means that the output provided by the second inverter I2 will be high or equal to 1. This means that the output OUT is equal to 1, which is VDDH.

Referring to the circuit in FIG. 2, as Q has now become 1 and QN is 0, the output of the first AND gate 2 will be high and the output of the second AND gate 4 will be low. This means that node A will be high whilst node B will be low. Accordingly, the first transistor m1 will be switched off, the second transistor m2 will be switched on, and the second transistor m2 will pass the signal INB to the node NET1. If IN is high, INB will be low. This means that the gate of the third transistor M3, which is connected or coupled to node NET1, will become low. As a consequence, the third transistor m3 is switched off. Node O1 becomes high again. This propagates through the first inverter i1 to provide a low clock signal to the first flip-flop FF1.

However, whenever the inverse of the low voltage input signal becomes 1, then transistor m3 is turned on. This causes node O1 to be pulled down and a positive clock edge to be applied to the first flip-flop clock input.

Reference is made to FIG. 3 which shows on the first line 302 the wave form of the low voltage input signal IN. As can be seen, this voltage signal is varying cyclically and periodically. The second wave form 304 shows the wave form at node O1 responsive to the variation in the low voltage input signal. As can be seen, small pulses are generated at the clock input of FF1 whenever the low voltage input signal 302 changes from one level to another. In the arrangement shown, the voltage going from 0 to 1 or 1 to 0 will trigger the same circuitry, that is the third transistor m3. Thus, if the input duty cycle is 50%, the output duty cycle also remains 50% and the rise and fall delays will be the same.

This may contrast with known arrangements where the output charging and discharging paths may be different, thereby causing variations in the rise/fall transition time at the output. Additionally, the known level translators may have the duty cycle at the output being different than that at the input.

It should be appreciated that the circuitry shown in the figures is by way of example only. For example, in some embodiments, the MOS transistors may be substituted by any other suitable transistors known in the art. In some embodiments, the P transistors may be substituted for N transistors and vice versa. In one embodiment, the fourth transistor M4 may be replaced by a constant current source.

MOS transistors are used in some embodiments. In alternative embodiments, different technology transistors may be used.

In another embodiment, the first and second transistors can be replaced by a respective transmission gate. A transmission gate comprises a PMOS transistor in parallel with an NMOS transistor. For the first transmission gate, the PMOS transistor would be controlled by signal A and the NMOS transistor by signal B. For the second transmission gate, the PMOS transistor would be controlled by signal B and the NMOS transistor by signal A.

Reference is made to FIG. 4 which shows yet another embodiment. The circuit in FIG. 4 is similar to that shown in FIG. 1 with an additional high voltage NMOS transistor m6 in series between the node O1 and the third transistor m3. The gate of the sixth NMOS transistor may be connected to a bias voltage which ensures that the drain of the third transistor m3 does not go beyond a low voltage maximum rating. In this case, the third transistor m3 is a low voltage transistor. If the third transistor m3 becomes a low voltage transistor, then even lower voltages (for example, in the region of down to 0.8V or even lower) may be converted to 3.3V and 5V.

Some embodiments may provide a level shifter where the discharging and charging path are the same. This may have the advantage that the input duty cycle remains intact because the input going from low to high, or vice versa, triggers the same circuitry.

Alternative embodiments maybe used to shift the level of a quantity other than voltage. For example, some embodiments may be used to shift a level of a current.

What is claimed is:

1. A circuit comprising:
   a control circuit operable to receive a first signal having a first voltage range, and further operable to receive an inverse of said first signal;
   first circuitry operable to generate a pulse when said first signal has a rising edge and when said inverse of said first signal has a rising edge; and
   second circuitry operable to receive said pulses and responsive thereto to provide a second signal, said second signal having a same duty cycle as said first signal and having a second voltage range different from said first voltage range.

2. A circuit as claimed in claim 1, wherein said first circuitry comprises a node at which said pulses are provided, said node operable to be controlled by a control transistor.

3. A circuit as claimed in claim 2, wherein said control transistor is operable to receive a gate voltage from said control circuit, said control circuit operable to change the gate voltage from a first state to a second state when said first signal is in a transitory state and thereafter to change the gate voltage from said second state to said first state when said first signal is at a steady value.

4. A circuit as claimed in claim 1, further comprising:
a control transistor operable to control a node receiving said pulses; and
a higher voltage transistor operable to control said control transistor, said higher voltage transistor operable to receive a bias voltage, said bias voltage being such that one of a drain and source of said control transistor does not exceed a lower voltage maximum rating.

5. A circuit as claimed in claim 1, wherein said control circuit comprises a first part operable to receive a signal dependent on an output of said second circuitry and a second part operable to receive a signal dependent on an inverse of said output of said second circuitry.

6. A circuit as claimed in claim 5, wherein one of said first and second parts is operable to receive said first signal and the other of said first and second parts is operable to receive an inverse of said first signal.

7. A circuit as claimed in claim 5, wherein said first part comprises circuitry identical to said second part.

8. A circuit as claimed in claim 5, wherein said first and second parts comprise respective transistors.

9. A circuit as claimed in claim 5, wherein said first and second parts comprise respective transmission gates.

10. A circuit as claimed in claim 5, said control circuit further comprising a first logic gate operable to receive said output of said second circuitry and produce said signal dependent on said output of said second circuitry received at said first part.

11. A circuit as claimed in claim 5, said control circuit further comprising a second logic gate operable to receive said inverse of said output of said second circuitry and produce said signal dependent on said inverse of said output of said second circuitry received at said second part.

12. A circuit as claimed in claim 1, wherein said first signal comprises a voltage signal and said second signal comprises a voltage signal.

13. A circuit as claimed in claim 1, wherein said first voltage range is less than said second voltage range.

14. A circuit as claimed in claim 1, wherein said second circuitry comprises a flip-flop.

15. A circuit as claimed in claim 14, wherein said flip-flop is operable to receive said pulses as a clock input.

16. A circuit as claimed in claim 14, wherein a data input of said flip flop is operable to receive an inverse output of said flip-flop.

17. A circuit as claimed in claim 14, wherein an inverse output of said flip-flop is operable to provide said second signal.

18. A circuit as claimed in claim 14 wherein an inverter is operable to invert an output of said flip-flop.

19. A circuit as claimed in claim 1, wherein said first signal is a periodic input signal, and said second signal is a periodic output signal.

20. A circuit comprising:
a first part operable to receive a first voltage signal having a first voltage level and a first control signal;
a second part operable to receive an inverse of said first voltage signal and a second control signal;
a transistor operable to be controlled by an output of said first and second parts;
a node, a voltage of which is operable to be controlled by said transistor to provide a pulse when said first voltage signal has a rising edge and when said inverse of said first voltage signal has a rising edge; and
a flip flop circuit operable to receive said pulses and responsive thereto to provide a second voltage signal, said second voltage signal having a same duty cycle as said first voltage signal and having a second voltage level greater than said first voltage level.

21. A circuit as claimed in claim 20, further comprising first control circuitry for controlling operation of said first part.

22. A circuit as claimed in claim 20, further comprising second control circuitry for controlling operation of said second part.

23. A circuit comprising:
input circuitry operable to receive a periodic signal having a first voltage range;
first circuitry operable to generate a pulse when said periodic signal has a rising edge and when an inverse of said periodic signal has a rising edge; and
second circuitry operable to receive said pulses and responsive thereto to provide an output signal, said output signal having a same duty cycle as said periodic signal and having a second voltage range.

24. A circuit as claimed in claim 23, wherein said second voltage range is greater than said first voltage range.

25. A circuit comprising:
control circuitry comprising a first transistor operable to receive an input signal having a first voltage range and a second transistor operable to receive an inverse of said input signal;
a control transistor operable to be controlled by an output of said control circuitry to control a node voltage to generate a pulse when said input signal has a rising edge and when said inverse of said input signal has a rising edge; and
flip-flop circuitry operable to receive said pulses and responsive thereto to produce an output signal having a same duty cycle as said input signal and having a second voltage range.

26. A circuit as claimed in claim 25, further comprising a first logic gate operable to receive an inverse of said output signal and a flip-flop reset signal, and produce a signal to drive said first transistor.

27. A circuit as claimed in claim 25, further comprising a second logic gate operable to receive said output signal and said flip-flop reset signal, and produce a signal to drive said second transistor.

28. A circuit as claimed in claim 25, wherein said flip-flop circuitry receives said pulses from a first inverter coupled to an input of said flip-flop circuitry.

29. A circuit as claimed in claim 25, wherein said flip-flop circuitry comprises a second inverter coupled to an output of a flip-flop.

30. A circuit as claimed in claim 25, wherein said control circuitry further comprises a third transistor operable to control a gate voltage of said control transistor.

31. A circuit as claimed in claim 25, further comprising a fourth transistor operable to produce a current at said control transistor.

32. A circuit as claimed in claim 25, further comprising a higher voltage transistor operable to control said control transistor, said higher voltage transistor operable to receive a bias voltage, said bias voltage being such that one of a drain and source of said control transistor does not exceed a lower voltage maximum rating.

* * * * *